US008614437B2

(12) United States Patent
Dimitrakopoulos et al.

(10) Patent No.: US 8,614,437 B2
(45) Date of Patent: Dec. 24, 2013

(54) ORGANIC UNDERLAYERS THAT IMPROVE THE PERFORMANCE OF ORGANIC SEMICONDUCTORS

(75) Inventors: Christos D. Dimitrakopoulos, Baldwin Place, NY (US); Laura Louise Kosbar, Mohegan Lake, NY (US); Debra Jane Mascaro, Fargo, ND (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 11/977,009

(22) Filed: Oct. 23, 2007

(65) Prior Publication Data

US 2009/0101892 A1 Apr. 23, 2009

Related U.S. Application Data (62) Division of application No. 10/303,618, filed on Nov. 25, 2002, now Pat. No. 7,285,440.

(51) Int. Cl.
*H01L 29/08* (2006.01)

(52) U.S. Cl.
USPC ............. 257/40; 257/E51.001; 257/E51.011; 257/E51.014; 257/E51.015

(58) Field of Classification Search
USPC ................ 257/40, E51.001–E51.052; 438/99
See application file for complete search history.

(56) References Cited

U.S. PATENT DOCUMENTS

| | | | |
|---|---|---|---|
| 5,500,537 A * | 3/1996 | Tsumura et al. | 257/40 |
| 6,335,539 B1 | 1/2002 | Dimitrakopoulos et al. | |
| 6,433,359 B1 * | 8/2002 | Kelley et al. | 257/40 |
| 6,646,285 B1 * | 11/2003 | Kagan et al. | 257/40 |
| 6,885,024 B2 * | 4/2005 | Bao et al. | 257/40 |
| 2003/0047729 A1 * | 3/2003 | Hirai et al. | 257/40 |
| 2003/0227014 A1 * | 12/2003 | Murti et al. | 257/40 |

OTHER PUBLICATIONS

Jackson, T.N., et al., *IEEE J. of Selected Topics in Quantum Elect.*, vol. 4, No. 1, Jan./Feb. 1998.
Dimitrakopoulos, et al., *Science*, vol. 283, 822, 1999.
Garnier, F., et al., *J. Am. Chem. Soc.*, vol. 115, 8716, 1993.
Dimitrakopoulos, C., et al., *J. Appl. Phys.*, vol. 80, 2501, 1996.
Gundlach, et al, *IEEE Electron Device Lett.*, vol. 18, No. 3, Mar. 1997.
H. Klauk, et al., *IEEE Trans on Electron Devices*, vol. 46, No. 6., Jun. 1999.
Lin, Y.Y., et al., *IEEE Electron Device Letters*, vol. 18, No. 12, Dec. 1997.
Gundlach, D.J., et al., *Tech. Dig. Intl. Devices Meeting*, 1999.
Kane, M.G., et al., *IEEE Electron Device Letters*, vol. 21, No. 11, Nov. 2000.
Wang, J., et al., *41st Electronic Materials Conf.*, Jun. 1999.

* cited by examiner

*Primary Examiner* — Minchul Yang
(74) *Attorney, Agent, or Firm* — Thomas A. Beck; Daniel P. Morris (57) ABSTRACT

A process for producing high performance organic thin film transistors in which the molecules in the organic thin film are highly ordered and oriented to maximize the mobility of current charge carriers. The uniform monolayer surface over various substrate materials so formed, result in a more reproducible and readily manufacturable process for higher performance organic field effect transistors that can be used to create large area circuits using a range of materials.

10 Claims, 13 Drawing Sheets

ORGANIC UNDERLAYERS THAT IMPROVE THE PERFORMANCE OF ORGANIC SEMICONDUCTORS

This application is a divisional application of U.S. Non-Provisional application Ser. No. 10/303,618, filed Nov. 25, 2002, which issued as U.S. Pat. No. 7,285,440 and claims the benefit of priority pursuant to 35 U.S.C. §120.

FIELD OF THE INVENTION

The present invention relates generally to the fabrication of electronic devices using organic semiconductors, and more particularly to the use of organic monolayers with specific molecular geometries to modify the substrate surface and improve the performance of subsequently vapor deposited organic semiconductors such as pentacene.

BACKGROUND OF THE INVENTION

Organic thin films (OTFs) have attracted considerable research interest due to their potential use as a replacement for other, more expensive semiconducting materials. Several organic materials, especially highly conjugated molecules that readily form molecular crystals such as pentacene and sexithiophene, have demonstrated semiconducting properties that approach those of amorphous silicon (Jackson, T. N., et. al., *IEEE J. of Selected Topics in Quantum Elect.*, Vol. 4, No. 1, Jan/February 1998). Other superior characteristics, such as mechanical flexibility, availability of room or low temperature deposition processes, and compatibility with inexpensive flexible substrate materials make the organic semiconductors viable replacements for amorphous silicon, especially in low cost and large area applications (Dimitrakopoulos, et. al., *Science*, Vol. 283, 283, 1999). These characteristics make organic thin films suitable candidates for use in thin film transistors (TFTs) for active matrix liquid crystal displays (AMLCD), low speed logic and radio frequency applications such as active tags or smart cards.

The electrical performance of the OTFs at room temperature is believed to be dominated by the difficulty of moving charge carriers from one molecule to the next because of disorder, defects, and chemical impurities which can form trapping sites within the film (Garnier, F., et. al., *J. Am. Chem. Soc.*, Vol. 115, 8716, 1993). It is generally accepted that increased ordering of the molecules in the OTF, especially in the first few monolayers deposited onto the substrate, will improve the mobility of charge carriers in the film.

The deposition conditions as well as the state of the substrate surface onto which the pentacene is deposited can have significant influence on the ordering and crystallinity of vapor deposited pentacene. Substrate temperature and deposition rate have been shown to affect the structure and size of the deposited pentacene crystals and the mobility of the deposited film (Dimitrakopoulos, C., et. al., *J. Appl. Phys.*, Vol. 80, 2501, 1996; Gundlach, et. al, *IEEE Electron Device Lett.*, Vol 18, No. 3, March 1997). Surface roughness has been shown to adversely affect the size of pentacene crystals (H. Klauk, et. al., *IEEE Trans on Electron Devices*, Vol. 46, No 6, June 1999).

A technique that has been reported in the literature to achieve improved pentacene deposition and electrical performance is the use of self-assembled monolayers (SAMs) of alkyl silanes (such as octadecyltrichlorosilane) on silicon dioxide or glass surfaces deposited either from solution or vapor phase (Lin, Y-Y, et. al., *IEEE Electron Device Letters*, Vol. 18, No. 12, December 1997; Gundlach, D. J., et. al., *Tech. Dig. Intl. Devices Meeting*, 1999; Kane, M. G., et. al., *IEEE Electron Device Letters*, Vol. 21, No. 11, November 2000) or alkyl thiols such as hexadecanethiol (Dimitrakopoulos, C., et. al., U.S. Pat. No. 6,335,539B1) or 2-mercapto 5-nitrobenzimidazole (Wang, J., et. al., *41st Electronic Materials Conf.*, June 1999) on metal contact surfaces such as gold. Other self-assembled monolayers have not been investigated in the literature to further understand or elaborate on the influence that each monolayer has on the orientation and ordering of the pentacene film during deposition.

SUMMARY OF THE INVENTION

One object of the present invention is to provide a process for producing high performance organic thin film transistors in which the molecules in the organic thin film are highly ordered and oriented to maximize the mobility of charge carriers.

Another object of this invention is to provide a uniform monolayer surface over various materials that will result in a more reproducible and readily manufacturable process for higher performance organic field effect transistors that can be used to create large area circuits using a range of materials.

Other objects of the present invention include:
(I) To provide a process that operates on common gate dielectrics that are compatible with organic semiconductors, such as silicon dioxide or aluminum oxide.
(II) To provide a process that operates on common high work function metals that are compatible with organic semiconductors, namely gold and platinum.
(III) To provide a process that operates at or near room temperature.
(IV) To provide a process that operates independently of the substrate used permitting, for example, the use of organic substrates.
(V) To provide a process that improves the performance of the devices at all scales, including very short channel lengths.

These and other objects and advantages can be achieved by utilizing the present method which includes a step of treating all exposed surfaces of the transistor structure with compounds under conditions effective in forming self-assembled monolayers (SAM) of molecules with specific chemical and geometric structures. It is noted that this may require treatment of the substrate with more than one compound to create SAMs on varying materials. It is also noted that the formation of the self-assembled monolayers of the present invention is carried out prior to deposition of the organic semiconductor. Specifically, the methods of the present invention comprise the steps of:

A) 1.) Forming a substrate for organic semiconductor deposition;
   2.) Depositing a gate electrode on this substrate and patterning it;
   3.) Depositing a gate insulator;
   4.) Depositing and patterning the source and drain electrodes;
   5.) Treating all exposed surfaces with compounds that will form appropriate self-assembled monolayers using molecules described hereinafter;
   6.) Depositing the organic semiconductors; or, B) 1.) Forming a substrate for organic semiconductor deposition;
   2.) Depositing a gate electrode on this substrate and patterning it;
   3.) Depositing a gate insulator;

4.) Treating the gate insulator with compounds that will form appropriate self-assembled monolayers using molecules described hereinafter;

5.) Depositing the organic semiconductor;

6.) Depositing and patterning the source and drain electrodes; or,

C) 1.) Forming a substrate for organic semiconductor deposition;

2.) Depositing and patterning the source and drain electrodes;

3.) Treating all exposed surfaces with compounds that will form appropriate self-assembled monolayers using molecules described hereinafter;

4.) Depositing the organic semiconductors;

5.) Depositing a gate insulator;

6.) Depositing and patterning a gate on the gate insulator.

Figure 1A:
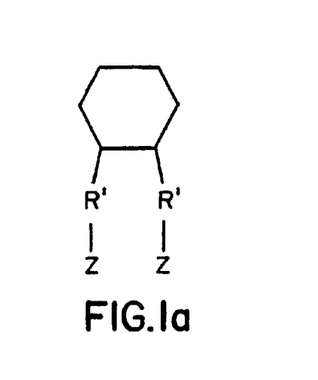
Figure 1B:
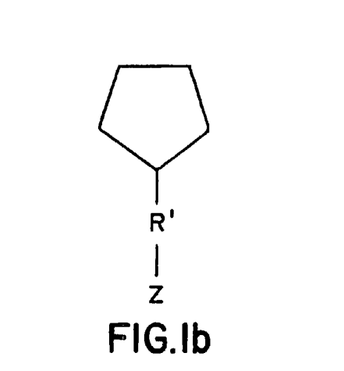
Figure 1C:
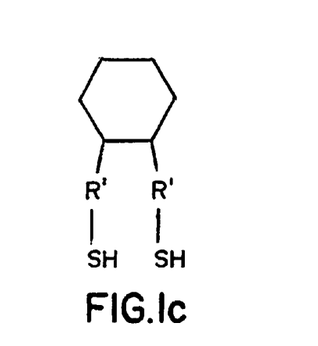
Figure 1D:
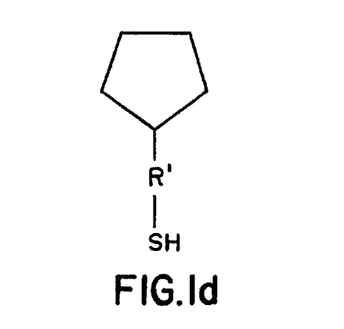

For treating all exposed surfaces with compounds that will form appropriate self-assembled monolayers use molecules having the general formula:

$$RZ \text{ or } RZ_2$$

and a basic structure related to those depicted in FIG. 1a, wherein Z is a chemical group that will bind to either the substrate or gate insulator (such as a chlorosilane), or the source and drain electrodes (such as a thiol); and R is an organic structure with either a saturated or unsaturated cycloaliphatic or aromatic ring system terminating the molecule such that the terminal bond on the molecule is parallel to the substrate surface, as depicted in the drawing.

The specific structure of the R group promotes improved ordering of subsequently deposited organic semiconductors, such as pentacene, perhaps by producing a surface similar to a pentacene crystal surface. Monolayers formed from molecules with ring systems terminating in bonds that are parallel to the surface result in organic semiconductor films with consistently improved electrical performance compared to semiconductor layers formed on monolayers with other chemical or geometric structures, or when no monolayer is used.

BRIEF DESCRIPTION OF THE DRAWINGS

The particular features and advantages of the present invention as well as other objects of the invention will become apparent from the following description taken in connection with the accompanying drawings in which:

FIGS. 1 (*a*) to 1(*d*) depict typical or generic structures for monolayer-forming molecules disclosed herein. Specifically, FIGS. 1(*a*) and 1(*b*) represents the basic structure for self-assembling molecules to be deposited on organic or oxide surfaces where Z can be a silane, germanium halide, carboxylic acid or phosphonic acid; FIGS. 1(*c*) and 1(*d*) represents the basic structure for self-assembling molecules to be deposited on metals through interaction with the thiol functional group.

FIGS. 5 (*a*)-(*j*) include depictions of some of the organic groups that can be used to replace "R" in the generic RZ or $RZ_2$ formula for species forming self-assembled monolayers.

FIGS. 6 (*a*)-(*f*) includes X-ray diffraction data collected from films of pentacene deposited on self-assembled monolayers comprising: 6(*a*) clean $SiO_2$; 6(*b*) cyclopentyltrichlorosilane; 6(*c*) cyclotetramethylenedichlorosilane; 6(*d*) 1,1-diethoxy-1-silacyclopent-3-ene; 6(*e*) octadecyltrichlorosilane; and 6(*f*) phenyltrichlorosilane.

FIGS. 7 (*a*)-(*h*) includes Atomic Force Microscope (AFM) micrographs of the pentacene surface topology and crystal size for pentacene deposited on various self-assembled monolayers.

DETAILED DESCRIPTION OF THE INVENTION

The present invention which provides a method of forming high performance organic thin film transistors and other like circuitry will now be described in more detail by referring to the drawings that accompany the present application. It is noted that the term "thin film", when used in conjunction with the organic semiconductor material, denotes a film having a thickness of 5 micrometers (5 µm) or less. The term "thin film" is used to distinguish the organic layer used as the semiconducting layer from bulk material, most often used in single crystalline form.

Figure 2:
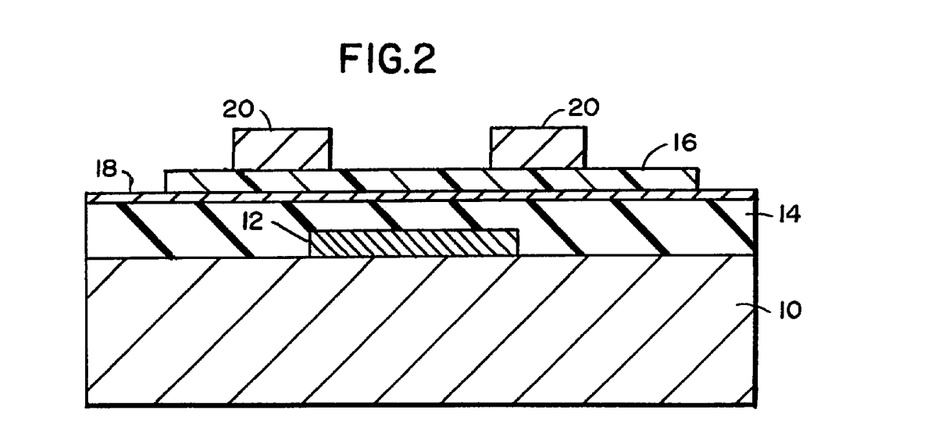
FIG. 2 is a cross-sectional view of a thin film transistor (TFT) structure, herein referred to as a "top contact" TFT, formed using the process of the present invention with the organic semiconductor deposited on the surface of the gate insulator.

Reference is first made to FIG. 2 which illustrates one possible TFT structure that can be produced using the process of the present invention. Specifically, the structure shown in FIG. 2 comprises a substrate 10 having a gate 12 formed on an exposed surface of substrate 10. The structure shown in FIG. 2 also comprises a gate insulator 14 that is formed on top of gate 12 and on any remaining exposed areas of substrate 10. It is noted that the gate insulator and the gate make up the gate region of the structure.

The organic thin film semiconductor 16 is deposited onto the gate insulator, and the source/drain electrodes 20 are deposited on top of the organic semiconductor. A key element of FIG. 2 is that a self-assembled monolayer 18 of the present invention is present on the gate insulator. The presence of self-assembled monolayers on the surface of the gate insulator with specific chemical structures improves the performance of the transistor. Without wishing to be bound by any explanation or theory, it is believed by the applicants' that the self-assembled monolayer of the present invention changes the behavior of the surface to which it is bound in a way that encourages the self-assembly of the organic semiconductor material into a more ordered system. It is believed that the orientation of the terminal aromatic or cyclic aliphatic group can be geometrically arranged in a similar fashion to that of the interfacial layer of pentacene molecules in a thin film molecular crystal, which is known from X-ray data to have the primary (long) axis of the molecule nearly perpendicular to the surface, resulting in the molecule oriented with its terminal carbon-carbon bond essentially parallel to the substrate. By matching the geometric structure of the monolayer surface to that predicted for pentacene thin films, it is expected that the ordering and orientation of subsequently deposited molecules will be enhanced more than for monolayers with other terminal groups. This behavior has not been suggested nor demonstrated in the prior art.

Suitable substrates that can be employed in the present invention include, but are not limited to: Si-containing substrates such as Si, $SiO_2$, SiGe, silicon-on-insulators and glass and Al-containing substrates such as sapphire; organic materials, especially those containing hydroxyl or phenolic functionality, interconnect structures and metal layers, and mixtures thereof. The substrate may also be a circuit board or laminate. A highly preferred substrate is a Si wafer (heavily doped) in which a thermally grown $SiO_2$ layer is present therein. This substrate is highly preferred since the $SiO_2$ region serves as a common gate.

The substrate may contain various active device regions and/or isolation regions either on the surface thereof or in the substrate itself. For example, the substrate may contain source/drain regions, shallow trench isolation regions, field oxide regions, metallization layers, dielectric layers and other like layers that are typically present in transistor structures.

Gate 12 is composed of a conventional gate conductor that is well known to those skilled in the art. For example, the gate can be composed of a conductive metal such as aluminum, tungsten, copper, or chromium, or alternatively, doped single crystalline Si or polysilicon can be used as the gate conductor or an organic conductor such as polyaniline or heavily doped organic semiconductor such as polythiophene. Of these gate materials, a gate comprising n-doped single crystalline Si is highly preferred herein. The gate is formed by first depositing or growing the gate material and then patterning the same using conventional lithography and etching. Conventional deposition processes that can be used in forming the gate include, but are not limited to: chemical vapor deposition, plasma-assisted chemical vapor deposition, sputtering, evaporation or other like deposition processes may be employed. When polysilicon or single crystal Si is used, the doping may take place during the deposition process using an in-situ process, or after using ion implantation and annealing.

Gate insulator 14 is comprised of conventional dielectric materials well known to those skilled in the art. Preferable gate insulators include inorganic oxide dielectric materials such as $SiO_2$, $Al_2O_3$, tantalum pentoxide, barium zirconate titanate, barium strontium titanate, and other like inorganic materials. Other insulating materials, including organic dielectric materials such as polyimide, polyamide, parylene, polymethylmethacrylate and other like organic materials, or inorganic materials such as $Si_3N_4$ or perovskite-type oxides or other like inorganic materials may be used with slight surface modification to produce hydroxyl functionality on the insulator surface. The gate insulator is formed using conventional processes well known to those skilled in the art, including any of the previously mentioned deposition processes used in forming the gate. $SiO_2$ is highly preferred in the present invention.

Electrodes 20 are composed of the same or different conductive metal, metal alloy, metal oxide or metal oxide alloy that contains at least one metal that is highly conductive. Such conductive metals are well known to those skilled in the art and include, for example, platinum (Pt), palladium (Pd), aluminum (Al), gold (Au), tungsten (W), chromium (Cr) or titanium (Ti). The electrodes may be single layered, but preferably the electrodes comprise a stack of two or more metal layers, i.e. a metal stack of Cr and Au, with Au on top, or Ti and Pt, with Pt on top. It is highly preferred that a high work function metal is in proximity to the organic complexes so that carrier injection is facilitated. The electrode (unpatterned) is formed using conventional deposition processes such as evaporation, chemical vapor deposition, plasma-assisted chemical vapor deposition and sputtering, and a patterned electrode is provided by conventional lithography and etching. Alternatively, a shadow mask may be used in forming the patterned electrodes.

Organic semiconductor 16 is a material including, but not limited to: pentacene, tetracene, and other fused ring structures. Of these materials, pentacene is preferred in the present invention. As stated above, the organic semiconducting material is a thin film material having a thickness of about 5 μm or less. More preferably, the organic semiconducting material has a thickness of from about 100 to about 1000 Å.

The organic semiconducting material is formed using conventional deposition processes that are well known in the art. For example, the organic semiconducting material is formed by molecular beam deposition, vacuum evaporation, sublimation, spin coating, dip coating, and other like deposition processes. Of these deposition processes, it is highly preferred that the organic semiconducting material be formed by molecular beam deposition in a high vacuum of less than $1\times10^{-6}$ torr.

As mentioned above, the structure of FIG. 2 (as well as FIGS. 3 and 4) include one or more self-assembled monolayers, 18 and 22, that are formed on the surfaces of the insulator or substrate (18) and on the electrodes (22) prior to deposition of the organic thin film semiconductor. The self-assembled monolayers of the present invention comprise compounds having the formula:

$$RZ \text{ or } RZ_2$$

and a basic structure related to FIG. 1a wherein the "head group", or reactive group (Z), is a group capable of binding through covalent bonding or strong chemical interactions to the desired surfaces. Desired head groups include but are note limited to: silanes, such as mono, di, or trichlorosilanes, trimethoxysilanes, or triethoxysilanes; germanium halides including mono, di or trichlorogermane, and mono, di, or tribromogermane; phosphonic acids; carboxylic acids, and thiols. Silanes are preferred attachment groups for $SiO_2$, or organic substrates that contain hydroxyl functionality, such as epoxy resins, although germaniumhalides are also applicable to these substrates. Phosphonic acids and carboxylic acids are preferred attachment groups for other oxide surfaces, such as aluminum oxide. Thiols are the preferred attachment groups for metals such as gold, silver, copper, and platinum.

The organic R group contains an aromatic, or a saturated or unsaturated, homo or heterocyclic, cycloaliphatic group. The parallel orientation of the external terminal bond in the aromatic or cycloaliphatic group relative to the substrate, as depicted in FIGS. 1 and 5, is one of the key disclosures of this invention.

FIGS. 5 (a) and (b) specify heterocyclic rings with silyl groups as part of the ring structure, although other similar atoms, such as germanium could be used in place of silicon. The identity of Z in FIGS. 5 (c)-(j) is dependent on the substrate on which the monolayer will be formed. Z=SH for SAMs on gold, platinum, etc. $Z=SiCl_3$, $SiCl_2R'$, $SiClR'_2$, $Si(OCH_3)_3$, $Si(OC_2H_5)_3$, $GeCl_3$, $PO(OH)_2$, to create monolayers on the gate insulator or substrate materials. In all cases, Z may include an alkyl spacer group between the ring structure and the terminal surface reactive group.

To achieve optimal ordering of the aromatic organic semiconductors, it is imperative that the SAM terminates with a bond that is parallel to the substrate, and hence to the desired orientation of the depositing semiconductor film. This can be accomplished by using cyclic structures with an odd number of carbon atoms that are attached to the surface through a single point of attachment [FIGS. 5 (a)-(e), (j)], or cyclic structures with an even number of carbon atoms that are attached to the surface through two points of attachment on adjacent ring atoms. See, e.g., (FIGS. 5 (f)-(i)). The ring structures may be saturated or unsaturated, aromatic, or have additional fused rings in addition to those depicted in FIGS. 1 and 5 as long as the additional rings do not change the orientation of the external, or terminal bond. Additional aliphatic groups at R' are also acceptable as long as they do not disrupt the SAM formation of the molecule.

Examples of suitable monolayer compounds for insulator and substrate materials include, but are not limited to: 1,1-diethoxy-1-silacyclopent-3-ene, cyclotetramethylenedichlorosilane, cyclopentyltrichlorosilane, (3-cyclopentadienyl-propyl)triethoxysilane, and 2,3-naphthalenedicarboxylic acid.

Examples of suitable monolayers compounds for deposition on electrode materials include, but are not limited to: cyclopentane thiol, 1,2-benzenedithiol, and 2,3-naphthalene-dithiol.

Self-assembled monolayers 18 on the gate insulator (as in FIGS. 2 and 3) or on the substrate (as in FIG. 4) are formed prior to deposition of the organic thin film by subjecting the substrate/insulator to a treatment process that is effective in forming a monolayer containing an appropriate head or binding group on the surface of the substrate/insulator. The substrate/insulator should be freshly cleaned prior to monolayer formation, and preferably by a method that will increase the hydroxyl content of the surface, such as exposure to an oxidizing acid cleaning solution or UV/ozone.

Specifically, the monolayer 18 is formed by immersing the structure in a silane, germane, carboxylic acid, or phosphonic acid containing solution in an appropriate anhydrous solvent. The monolayer-forming solution may be a concentrated solution or, more preferably, it is a dilute solution in a solvent which completely solubilizes the monolayer-precurser at concentrations up to at least 10-100 millimolar; examples include but are not limited to hexane, toluene, tetrahydrofuran, and acetone. In a highly preferred embodiment, of the present invention, a dilute solution containing from 1-10 millimolar 1,1-diethoxy-1-silacyclopent-3-ene in anhydrous hexane is employed in forming the self-assembled monolayer. The treatment process is carried out at or above room temperature for a time period of about 0.5 to about 48 hours. Elevated temperatures up to 70° C. may be used as long as the elevated temperature does not adversely affect the various layers of the structure. After treatment in the monolayer-forming solution, the structure is removed from the solution, rinsed in pure solvent, and dried. The drying step is typically conducted at a temperature of from about 25° C. to about 100° C. in an inert atmosphere for a time period from about 1 to about 15 minutes. Elevated temperatures may be used to insure that the reactive head groups have completely reacted with the surface.

Self-assembled monolayers 22 on the electrodes (as in FIGS. 3 and 4) are formed prior to deposition of the organic thin film by subjecting the electrodes to a treatment process that is effective in forming a monolayer of said thiol compounds on the surface of said electrodes. Specifically, the monolayer 22 is formed by immersing the structure in a thiol containing solution. The thiol containing solution may be a concentrated solution or, more preferably, it is a dilute solution in which the thiol compound is dissolved in a solvent such as ethanol or heptane. In a highly preferred embodiment of the present invention, a dilute solution containing from 0.001 to about 0.01% thiol compound in ethanol is employed in forming the self-assembled monolayer. The treatment process is carried out at or above room temperature for a time period of about 0.5 to about 24 hours. After treatment in the thiol solution, the structure is removed from the solution, rinsed in pure solvent, and dried. The drying step is typically conducted at a temperature of from about 25° C. to about 50° C. in an inert atmosphere for a time period from about 1 to about 5 minutes.

If more than one monolayer is to be deposited on the substrate (as in FIGS. 3 and 4), the monolayer on the electrodes is formed after the monolayer on the substrate/insulator. Once all of the monolayers have been formed, the organic semiconductor material is deposited thereon.

Figure 3:
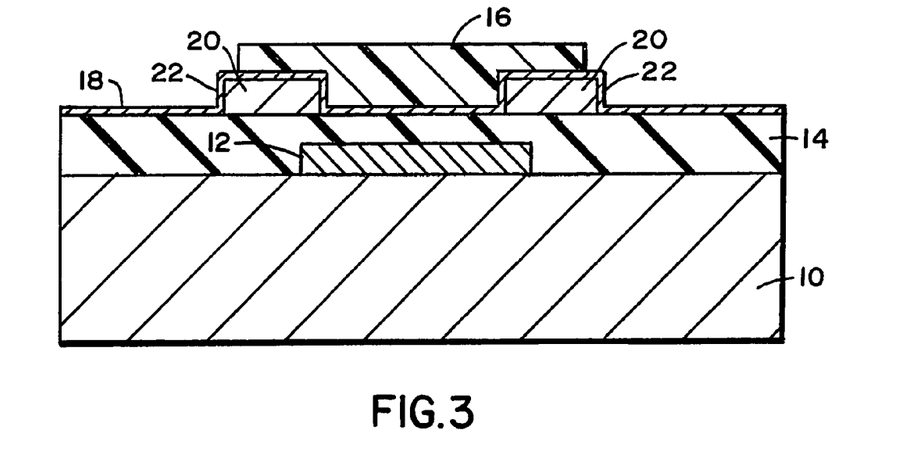
FIG. 3 is a cross-sectional view of an alternative TFT structure, herein referred to as a "bottom contact" TFT, formed using the process of the present invention with the organic semiconductor deposited on the surfaces of both the gate insulator and the source/drain electrodes.
Figure 4:
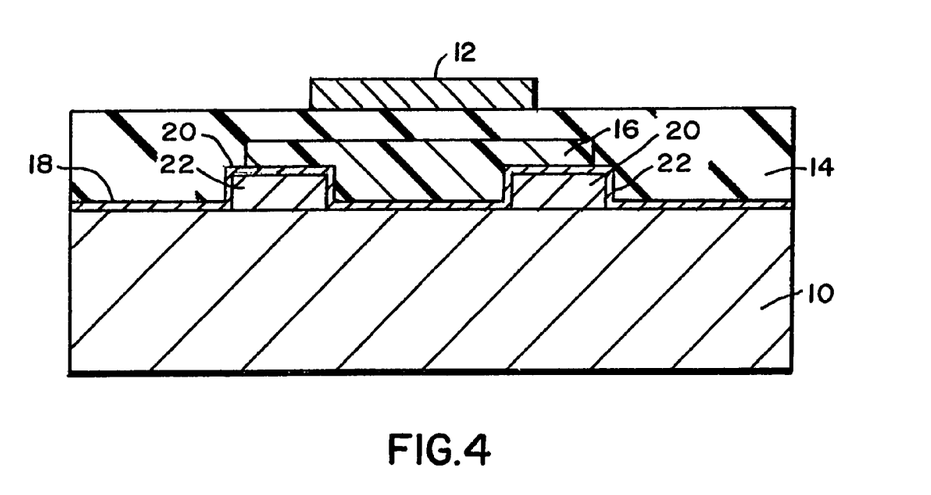
FIG. 4 is a cross-sectional view of yet another alternative TFT structure that can be formed using the process of the present invention with the organic semiconductor deposited on the surfaces of the substrate and the source/drain electrodes. The gate insulator and gate electrode are deposited onto the semiconductor.
Figure 5A:
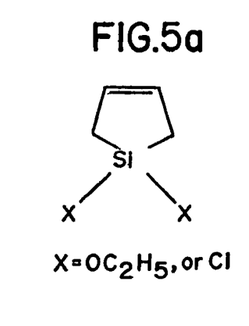
Figure 5B:
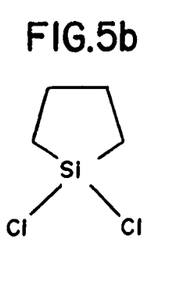
Figure 5C:
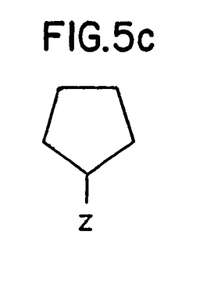
Figure 5D:
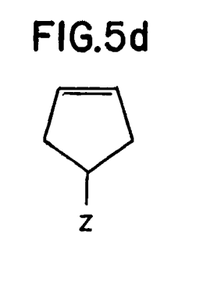
Figure 5E:
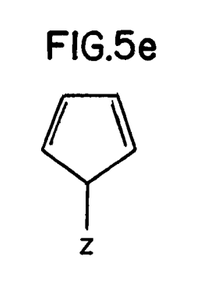
Figure 5F:
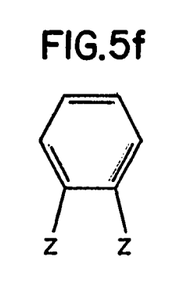
Figure 5G:
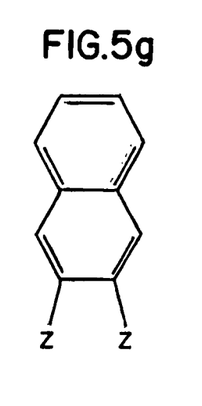
Figure 5H:
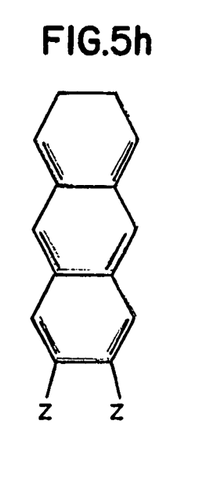
Figure 5I:
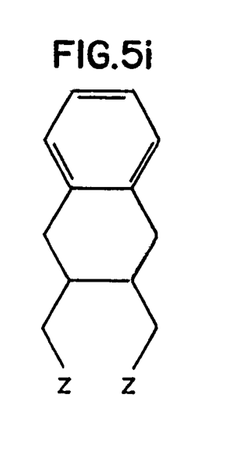
Figure 5J:
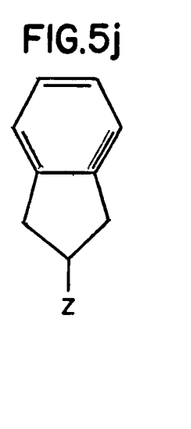

FIGS. 2, 3, 4, and the above description illustrate three embodiments of the present invention. Other standard thin film transistor structures that are apparent to those skilled in the art can also be used in the present invention. In these other structures, the chemical structure/geometry of the monolayer and its interaction with and ordering of the organic semiconductor distinguishes the present invention from prior art transistor structures.

Preferred embodiments of the present invention are illustrated in the following Examples.

Example 1

Highly doped silicon wafers with 5000 Å of thermally grown oxide were cleaned using chloroform, UV/ozone, and a heated solution of sulfuric acid and hydrogen peroxide, followed by rinsing and drying. The samples were immersed in 1 millimolar solutions of the following silanes in anhydrous hexane: octadecyltrichlorosilane, phenyltrichlorosilane, cyclopentyltrichlorosilane, cyclotetramethylenedichlorosilane, and 1,1-diethoxy-1-silacyclopent-3-ene, as well as an untreated wafer that was used as a control. The solutions were heated to 50° C., and the samples remained in contact with the silane solution overnight. The samples were rinsed several times in fresh hexane and dried in an inert atmosphere. The samples were baked at 50° C. for 10 minutes to promote the reaction of any unreacted chlorosilane groups. An approximately 300 Å thick film of pentacene was deposited onto the samples through a metal shadow mask using molecular beam deposition techniques. Source and drain electrodes were deposited on top of the organic semiconductor by evaporating gold through a metal mask, producing a device structure similar to that shown in the cross section in FIG. 2.

Figure 6A:
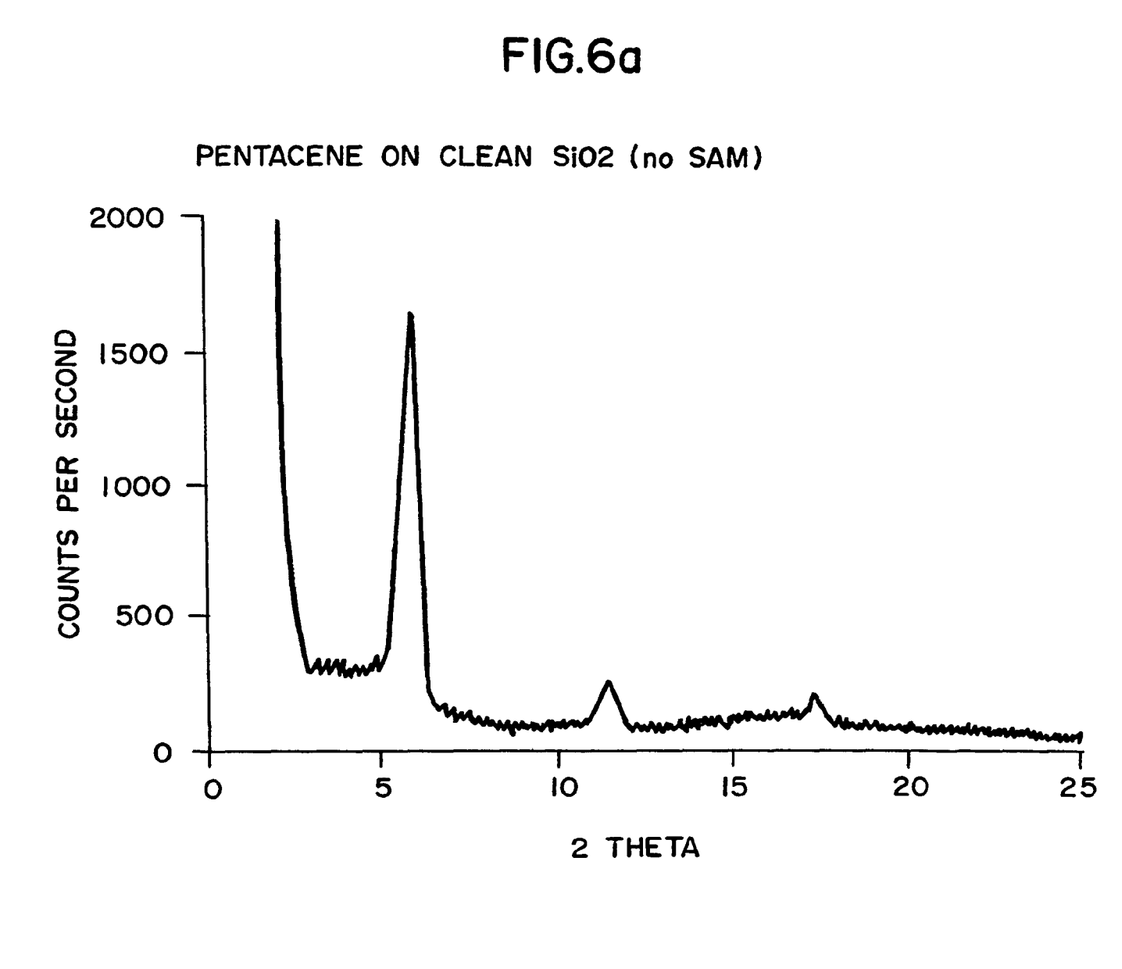
Figure 6B:
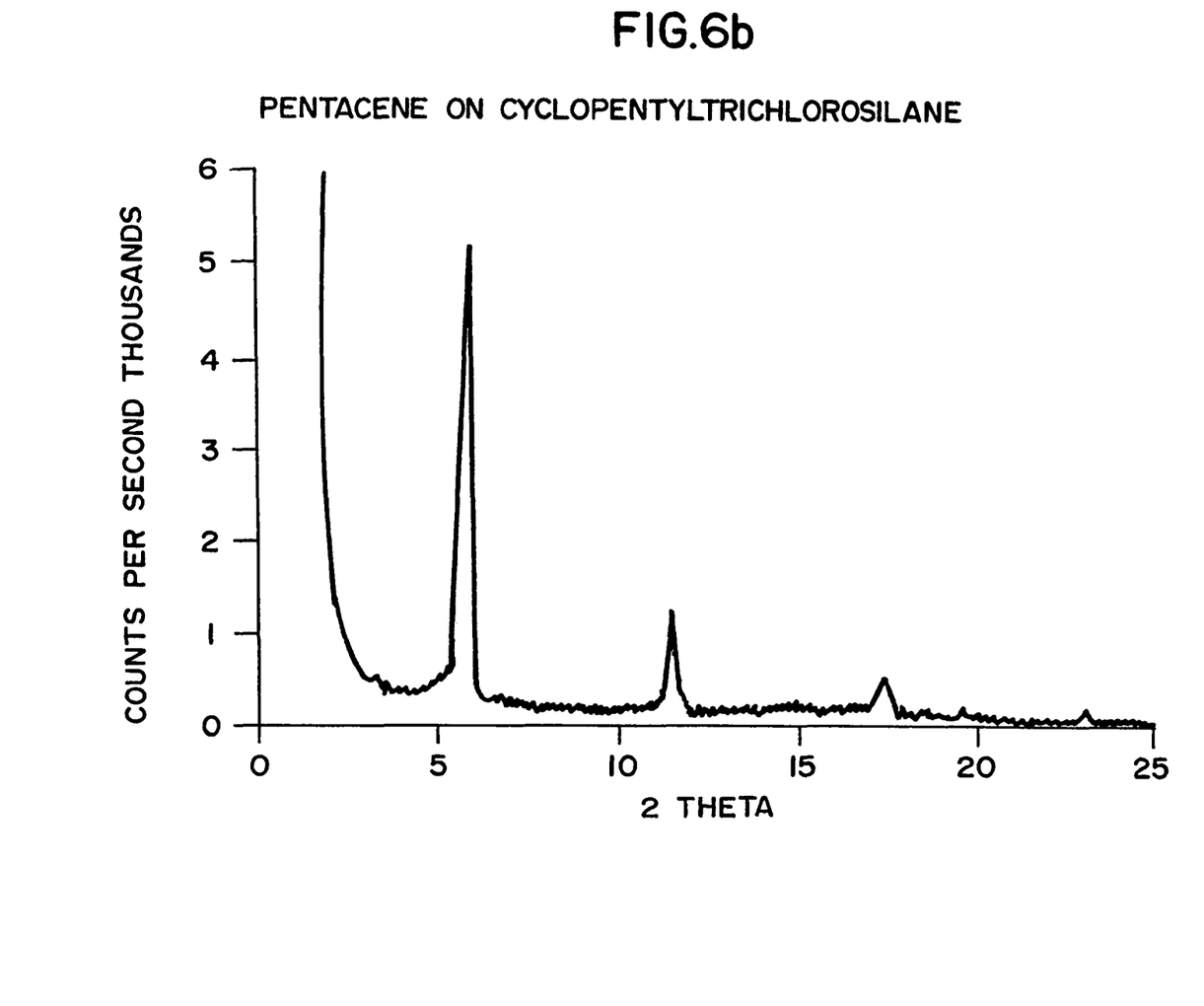
Figure 6C:
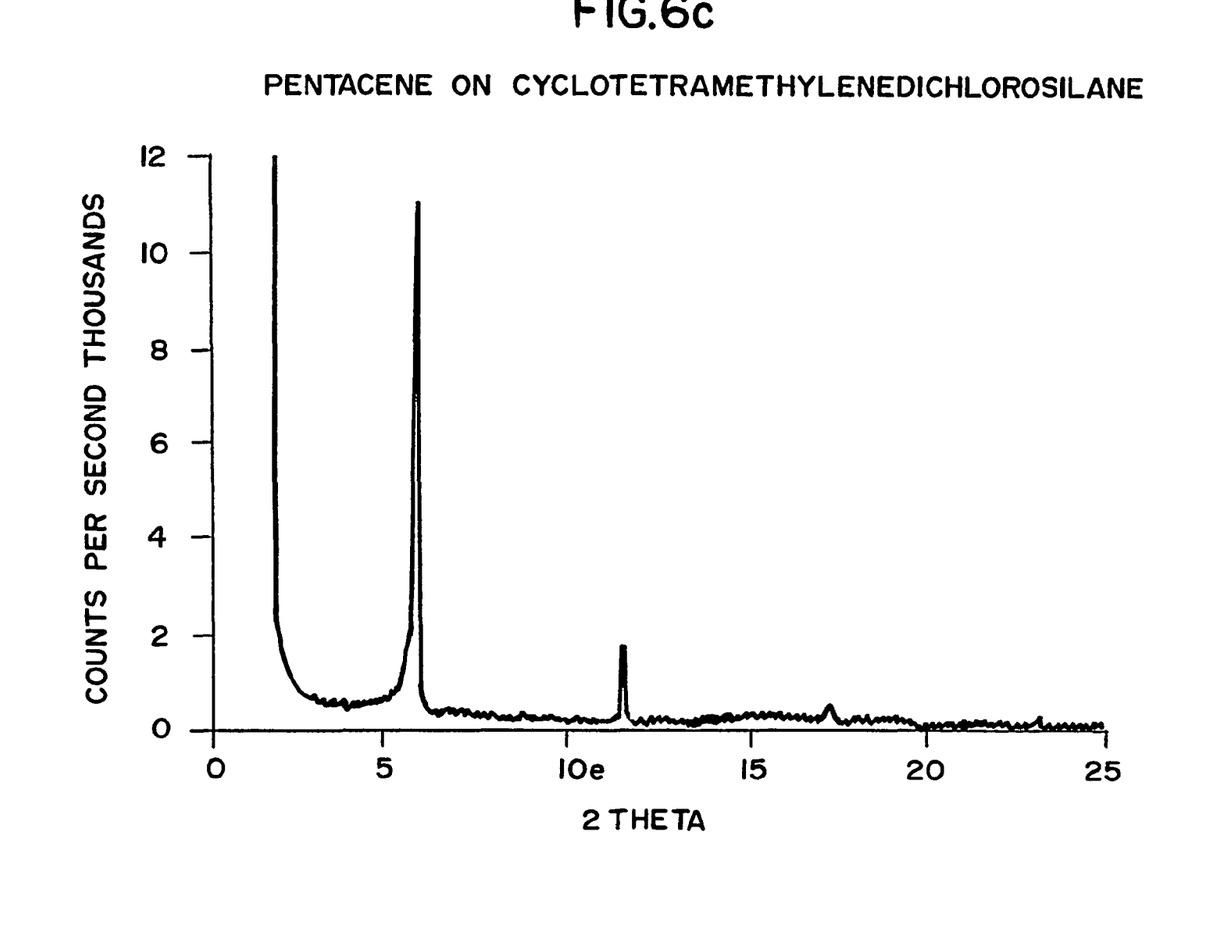
Figure 6D:
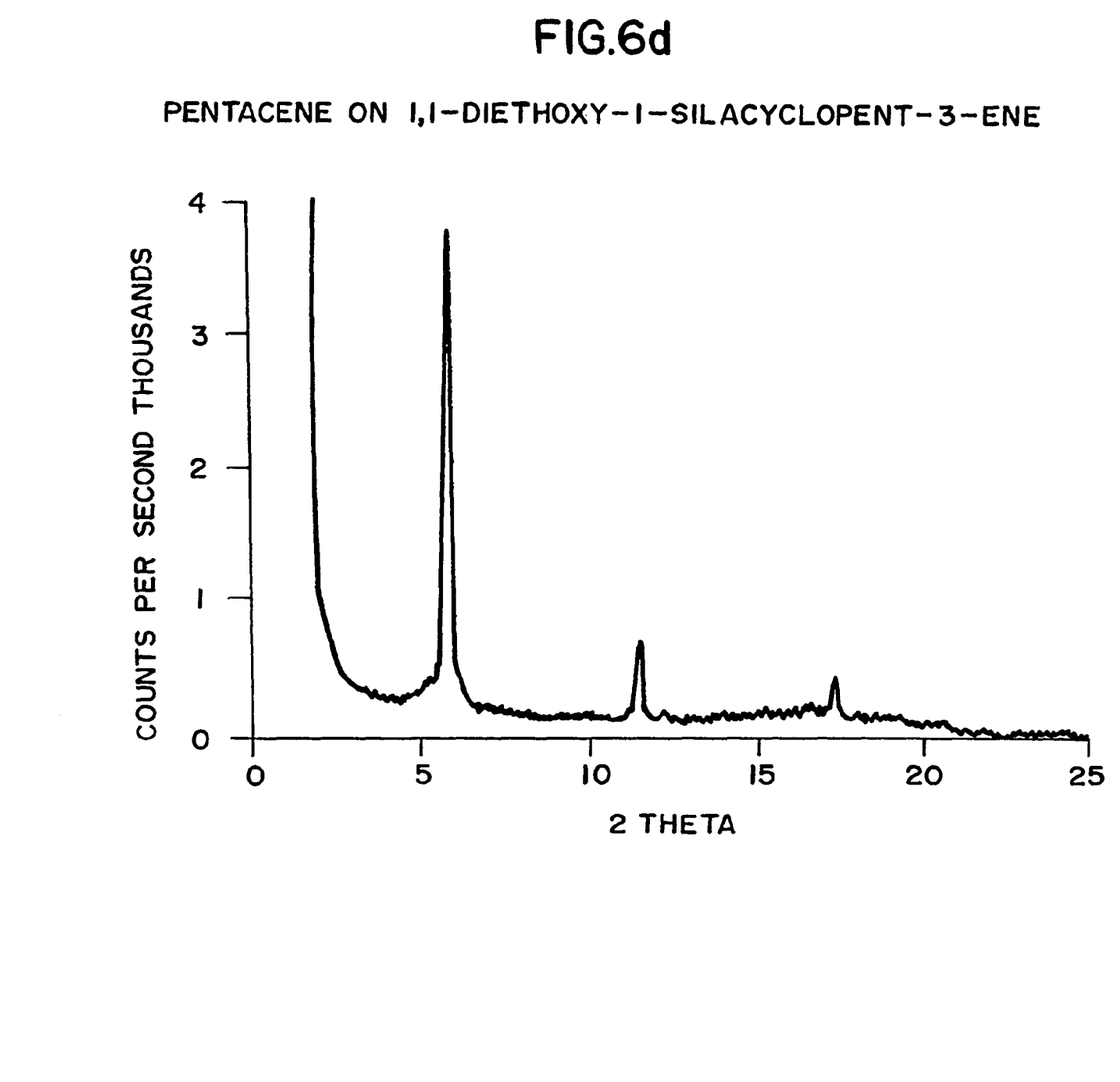
Figure 6E:
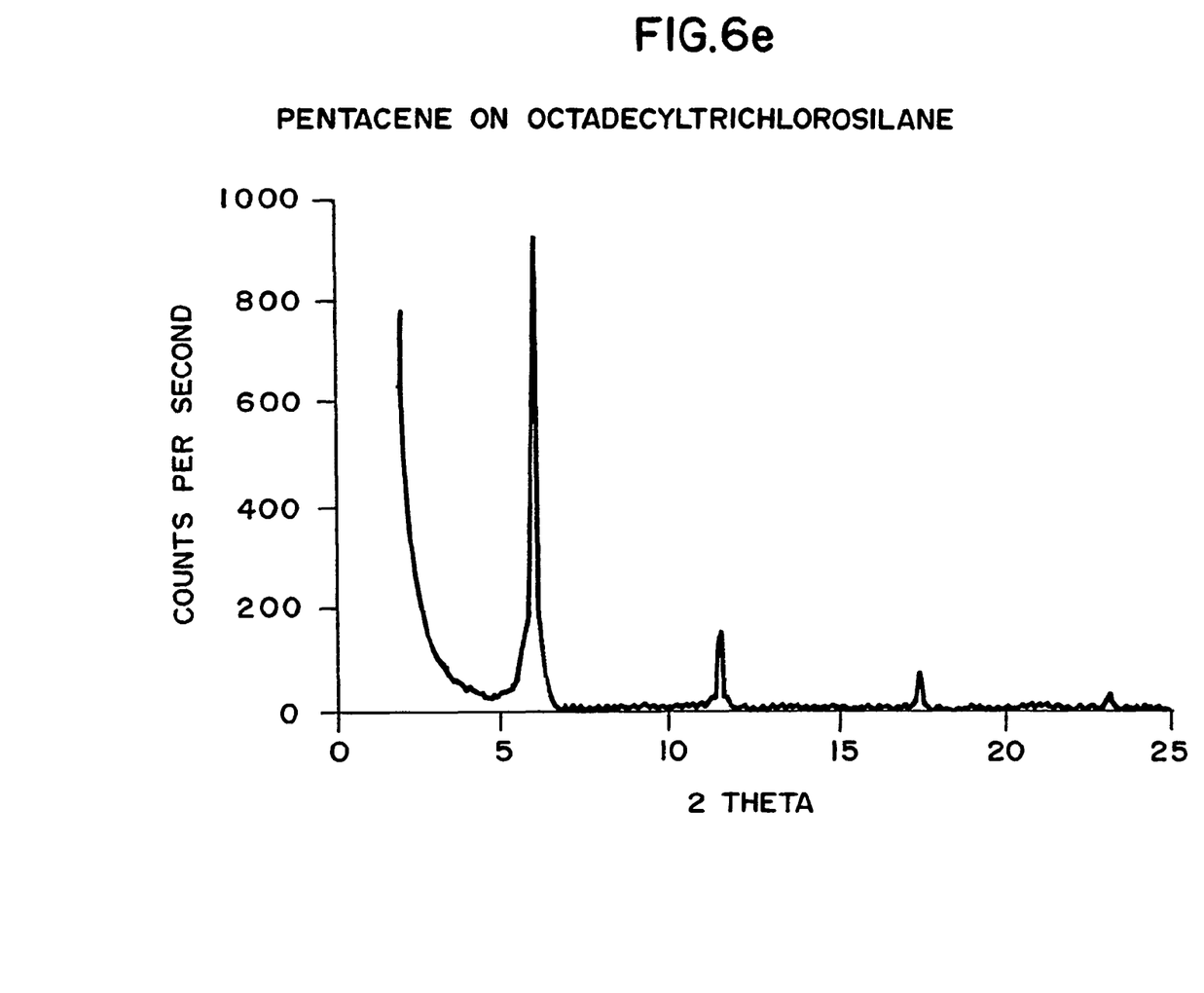
Figure 6F:
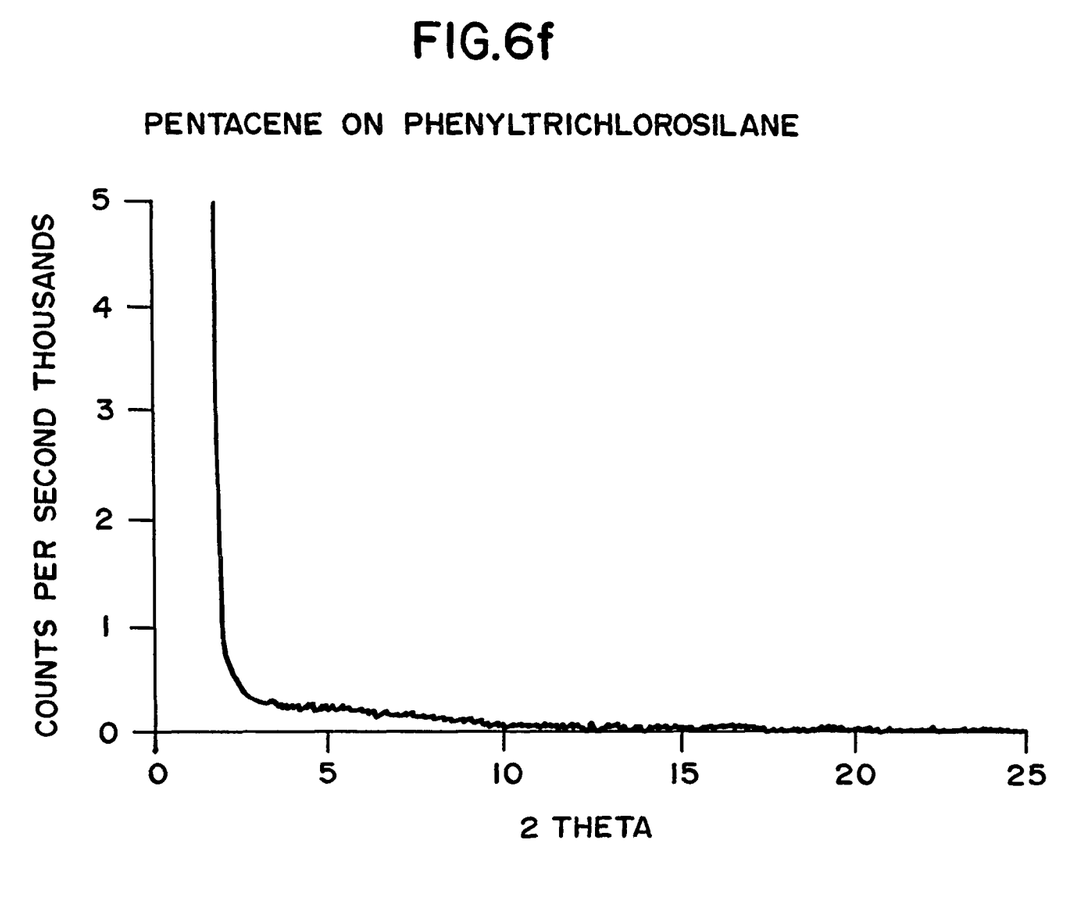

The ordering and electrical properties of the organic semiconductor film on these samples was measured by several techniques, including X-ray scattering, atomic force microscopy (AFM), and standard field effect I-V measurements of the transistors, including mobility measurements in the linear and saturation regimes and current on/off ratios. The X-ray scattering data indicates the overall degree of ordering of the pentacene in the film. Highly ordered thin film pentacene will produce sharp (narrow) scattering peaks equivalent to "d" (interlayer) spacings of approximately 15.4 Å, denoted as the (001) spacing (Dimitrakopoulos, C., et. al., *J. Appl. Phys.*, Vol. 80, No. 4, 2501, 1996). Smaller scattering peaks at 7.7 (002), 5.13 (003), and 3.85 (004) are also observable in well ordered films. The X-ray scattering data for these samples is included in FIG. 6. The scattering data indicates that the pentacene forms fairly ordered films when no underlayer is used (the pentacene is deposited on bare $SiO_2$) (FIG. 6a); a very ordered thin film structure for samples with monolayers of cyclopentanetrichlorosilane (FIG. 6b), cyclotetramethylenedichlorosilane (FIG. 6c), 1,1-diethoxy-1-silacyclopent-3-ene (FIG. 6d), and octadecyltrichlorosilane (OTS)(FIG. 6e)—which is consistent with literature reports on OTS (Jackson, T. N., et. al., *IEEE J. of Selected Topics in Quantum Elect.*, Vol. 4, No. 1, January/February 1998); but there is no observable ordered thin film structure when phenyl silane is used as the underlying monolayer (FIG. 6f).

The electrical performance of the sample with the phenyl silane monolayer was consistent with the observed difference in the x-ray scattering. The pentacene on the phenyl silane had a mobility of 0.006 $cm^2V^{-1} sec^{-1}$, while those of the samples that had typical scattering patterns for pentacene all had mobilities greater than 0.1 $cm^2V^{-1} sec^{-1}$. The geometry of the phenyl silane appears to have a disruptive influence on the ordering of depositing pentacene, as verified by both the X-ray and electrical measurements.

Figure 7A:
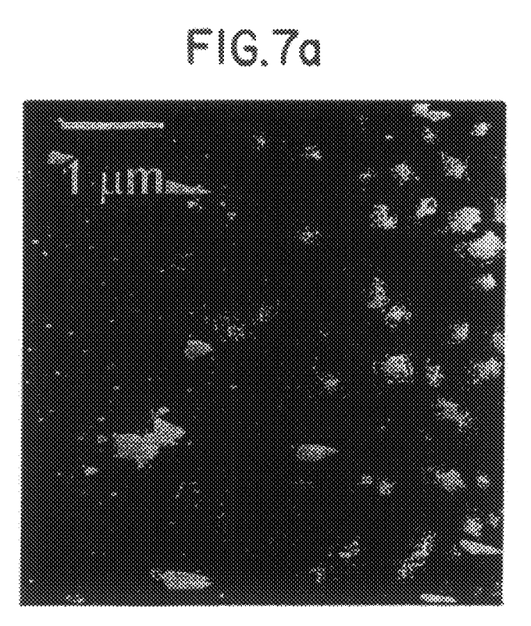
Figure 7B:
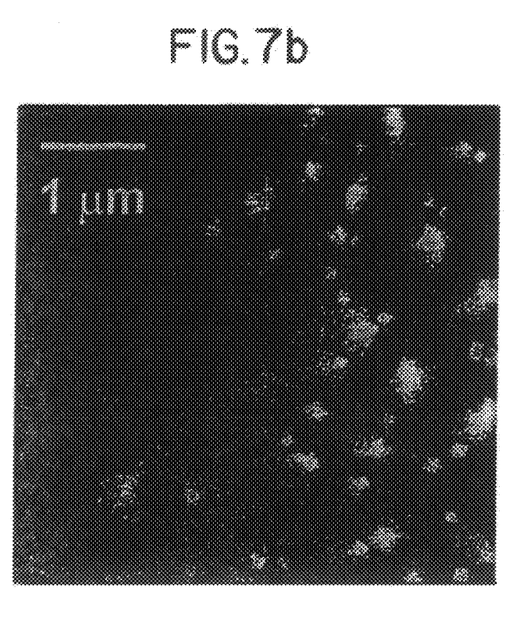
Figure 7C:
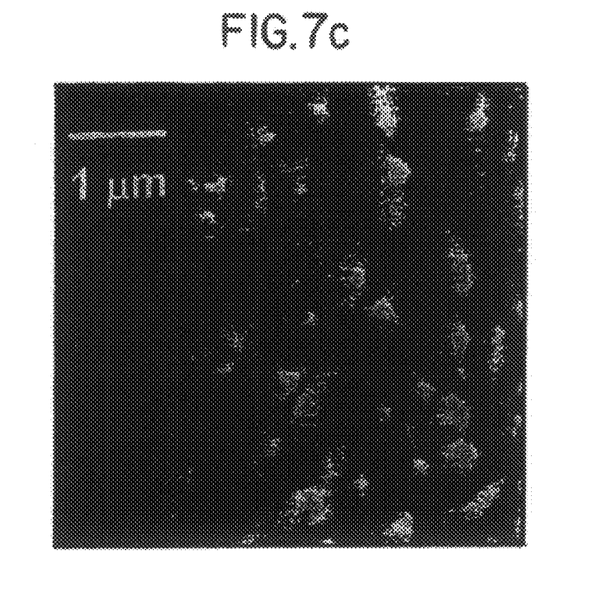
Figure 7D:
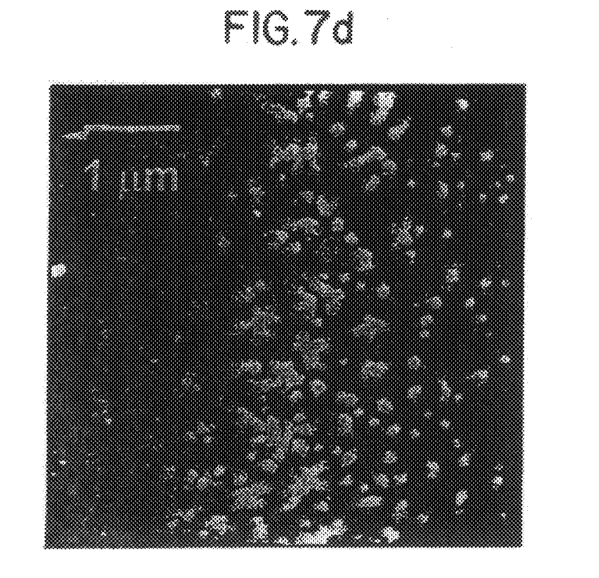
Figure 7E:
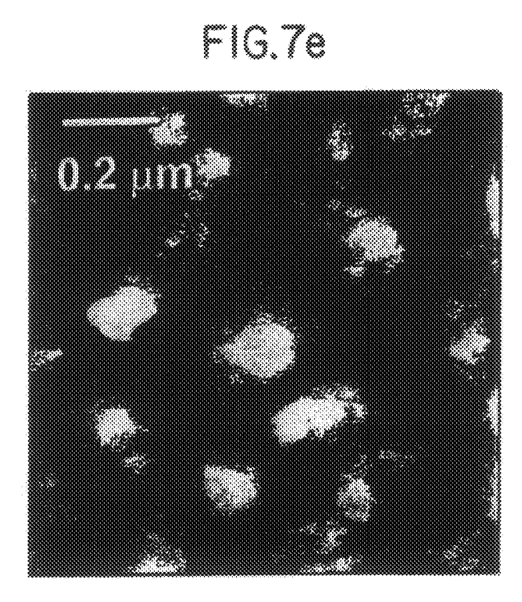
Figure 7F:
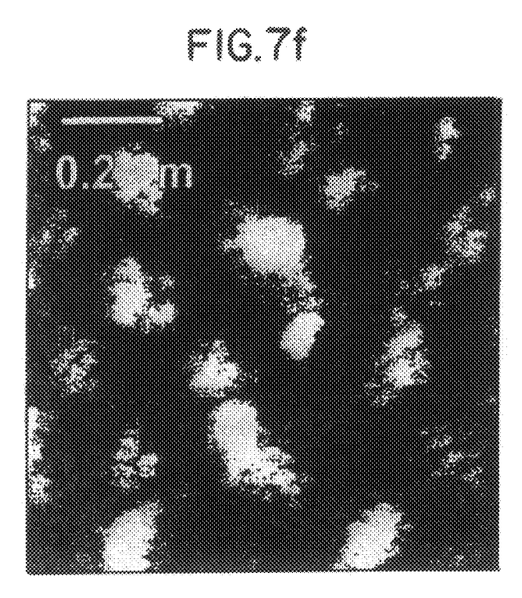
Figure 7G:
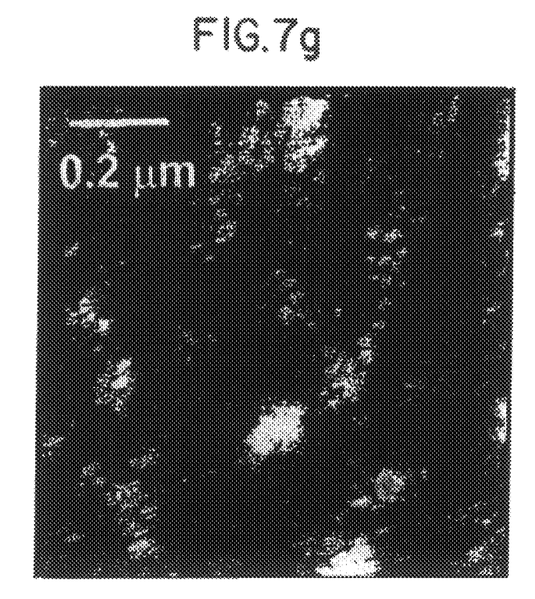
Figure 7H:
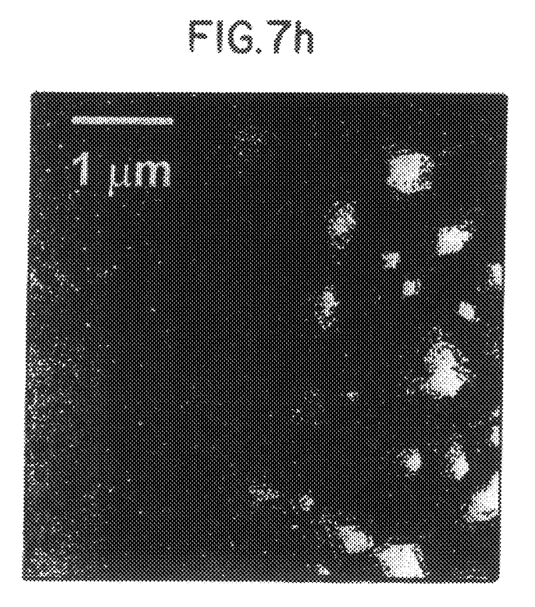

The performance of pentacene layers is also affected by the size of the pentacene crystals—with larger crystals (and so fewer grain boundaries) having improved electrical performance. Atomic force microscopy (AFM) was used in the tapping mode to determine the crystal structure of pentacene films deposited on various monolayers. The AFM images are reproduced in FIG. 7. Pentacene deposited on a favorable surface—one that has the terminal ring bond parallel to the surface (as depicted in FIGS. 1 and 5)—will form large, angular, terraced crystal structures, such as those observed for the cyclopentanetrichlorosilane (FIG. 7a), cyclotetramethylenedichlorosilane (FIG. 7b), and 1,1-diethoxy-1-silacyclopent-3-ene (FIG. 7c). These films also had the highest mobilities in both the linear and saturation regimes. The mobilities in the linear regime were 0.35, 0.35, and 0.39 $cm^2V^{-1} sec^{-1}$ respectively, and those in the saturation regime were 0.28, 0.27, and 0.33 $cm^2V^{-1} sec^{-1}$, respectively. Mobilities as high as approximately 1.0 $cm^2V^{-1} sec^{-1}$ have been measured for pentacene on 1,1-diethoxy-1-silacyclopent-3-ene, and it consistently produces devices with mobilities above 0.3 $cm^2V^{-1} sec^{-1}$. A film of pentacene on octadecyltrichlorosilane, which has terminal methyl groups, exhibited somewhat smaller and more dendridic grains (FIG. 7d), and also a smaller mobility of 0.17 $cm^2V^{-1} sec^{-1}$ in the linear regime, and 0.14 $cm^2V^{-1} sec^{-1}$ in the saturation regime. Films on phenyl terminated monolayers, such as phenyltrichlorosilane (FIG. 7e), phenyl thiol (FIG. 7f) or anthracene thiol (FIG. 7g), which all have a ring carbon atom rather than a ring bond in the terminal position, produced very small (note the smaller scale for these micrographs) and poorly layered crystals that were consistent with their very poor (almost two orders of magnitude lower mobility) electrical performance. Pentacene deposited on smooth, thermally grown oxide grows relatively large, angular terraced crystals (FIG. 7h), similar to those on the ring structures with terminal parallel bonds, although the mobility was slightly lower, averaging around 0.20-0.37 $cm^2V^{-1} sec^{-1}$ in the linear regime, and 0.14-0.25 $cm^2V^{-1} sec^{-1}$ in the saturation regime. The on/off ratio of the current (Ion/Ioff) was consistently better for the devices where the pentacene was deposited on a SAM than for those on pure $SiO_2$ surfaces, generally by about an order of magnitude.

Example 2

Bottom contact devices, as depicted in the cross section in FIG. 3, require monolayers to be applied on both the gate insulator and the electrodes to produce a uniform surface for pentacene deposition. In these cases, highly doped silicon wafers with 5000 Å of thermally grown oxide were cleaned using chloroform, UV/ozone, and a heated solution of sulfuric acid and hydrogen peroxide, followed by rinsing and drying. Patterned gold or gold on chromium contacts were deposited by evaporation through a metal shadow mask. Samples were immersed in 1 millimolar solutions of octadecyltrichlorosilane or 1,1-diethoxy-1-silacyclopent-3-ene in anhydrous hexane, and untreated samples were used as controls. The solutions were heated to 50° C., and the samples remained in contact with the silane solution overnight. The samples were rinsed several times in fresh hexane and dried in an inert atmosphere. The samples were baked at 50° C. for 10 minutes to promote the reaction of any unreacted chlorosilane groups. Samples were then placed in 1 millimolar room temperature solutions of either hexadecanethiol or cyclopentylthiol in ethanol. The samples remained in the solution overnight, after which they were rinsed in pure ethanol and dried under a stream of nitrogen. An approximately 300 Å thick film of pentacene was deposited onto the samples through a metal shadow mask using molecular beam deposition techniques, producing a structure similar to that depicted in cross section in FIG. 3.

The electrical properties of the devices were measured and the mobility of devices with just a thiol monolayer on the electrodes was lower than for samples that had monolayer treatments on both the gate insulator and the electrodes, and those treated with cyclic organic molecules with bonds parallel to the substrate were higher than those with terminal methyl groups. The mobility in the linear regime for samples treated with cyclopentanethiol and cyclopentanetrichlorosilane was 0.24 $cm^2V^{-1} sec^{-1}$, while that for devices treated with hexadecanethiol and octadecanetrichlorosilane was 0.18 $cm^2V^{-1} sec^{-1}$. The mobilities measured in the saturation regime exhibited a similar trend, where the mobility of devices treated with cyclopentanethiol and cyclopentanetrichlorosilane was 0.24 $cm^2V^{-1} sec^{-1}$, while that for devices treated with hexadecanethiol and octadecanetrichlorosilane was 0.20 $cm^2V^{-1} sec^{-1}$. Devices treated with phenylthiol and phenyltrichlorosilane had a mobility of only $1\times10^{-4} cm^2V^{-1} sec^{-1}$.

For comparison, devices treated with only cyclopentanethiol or hexadecanethiol had mobilities of 0.09 $cm^2V^{-1} sec^{-1}$, and devices devoid of any monolayer treatment exhibited mobilities of 0.05 $cm^2V^{-1} sec^{-1}$.

The deposition of pentacene is affected by the geometry and structure of the surface onto which it is deposited. Pentacene appears to form the most well-organized and oriented films when it is deposited on substrates that have flat bonds parallel to the surface in the terminal position on a self-assembled monolayer. The worst surface, which produces highly disordered pentacene films that have very poor charge carrier mobility are those that have ring structures with a carbon atom in the ring in the terminal position. Thus, it appears that the geometry of the SAM relative to the depositing pentacene, rather than just the molecular composition of the monolayer is the key factor to achieving improved ordering and performance from deposited organic semiconducting films.

By practicing the method of the present invention, the following advantages to the conventional solution of transistor fabrication using organic semiconductors have been shown:

(a) Increased mobility of semiconducting layers of vapor deposited pentacene have been demonstrated on the disclosed cyclic monolayers.

(b) The measured mobilities of pentacene layers on the disclosed monolayer are more reproducible than on substrates without monolayers or with monolayers having other terminal groups.

(c) The ratio of the on and off currents is improved and more consistent than on substrates without monolayers or with monolayers having other terminal groups While the present invention has been particularly shown and described with respect to preferred embodiments thereof, it will be understood by those skilled in the art that the foregoing and other changes in form and detail may be made without departing from the spirit and scope of the present

Having thus described our invention in detail, what we claim as new and desire to secure by the Letters Patent is:

1. An organic thin film transistor having a structural arrangement of elements comprising:
   a substrate, said substrate having an upper and a lower surface;
   a gate selected from the group consisting of a conductive metal, a doped single crystalline Si, polysilicon, and an organic conductor, having an upper surface, a lower surface and side surfaces, said lower surface of said gate positioned on and in contact with a portion of said upper surface of said substrate;
   a gate insulator having an upper surface and a lower surface, said lower surface of said gate insulator covering, and in contact with, said upper and side surfaces of said gate, and any remaining exposed area of said substrate not covered by said bottom surface of said gate, said gate insulator being selected from the group consisting of an inorganic oxide dielectric material, and an organic dielectric material,
   a self-assembled monolayer having an upper surface and a lower surface wherein said lower surface of self-assembled monolayer is formed on and is in contact with said substrate or said upper surface of said gate insulator;
   an organic thin film semiconductor having an upper surface and a lower surface, and having a thickness of from about 100 to about 1000 Å wherein said lower surface of said organic thin film semiconductor is in contact with said upper surface of said self-assembled monolayer;
   a source electrode and a drain electrode, each said electrode having an upper surface and a lower surface and being positioned adjacent to each other, said lower surface of said source electrode and said lower surface of said drain electrode being in contact with said upper surface of said organic thin film semiconductor,
   said self-assembled monolayer comprising a compounds having the formula:

RZ wherein Z is a reactive group selected from the group consisting mono-chlorosilane, di-chlorosilane, trichlorosilane, triethoxysilane; mono-chlorogermane, di-chlorogermane, tri-chlorogermane, carboxylic acids, and thiols;
   said (Z) reactive groups capable forming a covalent bond or strong chemical interaction with said upper surface of said gate insulator or said substrate,
   said parallel orientation being accomplished using said cyclic ring structures with an odd number of carbon atoms that are attached to said upper surface of said gate insulator or said substrate surface through a single point of attachment, or
   using said cyclic ring structures with an even number of carbon atoms that are attached to said upper surface of said gate insulator or said substrate through two points of attachment on adjacent ring atoms.

2. The organic thin film transistor of claim 1 wherein said gate is formed below said organic thin film semiconductor.

3. The thin film transistor of claim 1 wherein said organic conductor is selected from the group consisting of polyaniline and polythiophene surrounded by said gate insulator.

4. The organic thin film transistor of claim 1 wherein said source electrode and said drain electrodes are selected from the group consisting of the same or different conductive metal, metal alloy, metal oxide, metal alloy oxide, or a stack thereof.

5. The organic thin film transistor of claim 4 wherein said same or different conductive metal is a metal selected from the group consisting of gold, platinum, tungsten, palladium, aluminum, chromium, titanium, and a stack thereof.

6. The organic thin film transistor of claim 4 wherein said conductive metal is gold, chromium, platinum, titanium or a stack thereof.

7. The organic thin film transistor of claim 1 wherein said organic thin film semiconductor is a material selected from the group consisting of pentacene, tetracene, or other fused ring organic semiconductors.

8. The organic thin film transistor of claim 7 wherein organic thin film semiconductor is pentacene.

9. The organic thin film transistor of claim 1 wherein said substrate is a Si-containing substrate selected from the group consisting of $SiO_2$, Si, SiGe, silicon-on-insulator and glass.

10. The organic thin film transistor of claim 1 wherein said substrate is an Al-containing substrate.

* * * * *